United States Patent
Lu et al.

(10) Patent No.: US 7,435,664 B2
(45) Date of Patent: Oct. 14, 2008

(54) WAFER-LEVEL BONDING FOR MECHANICALLY REINFORCED ULTRA-THIN DIE

(75) Inventors: Daoqiang Lu, Chandler, AZ (US); John Tang, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 186 days.

(21) Appl. No.: 11/479,835

(22) Filed: Jun. 30, 2006

(65) Prior Publication Data
US 2008/0003720 A1 Jan. 3, 2008

(51) Int. Cl.
*H01L 21/00* (2006.01)

(52) U.S. Cl. ............... 438/460; 438/106; 438/113; 438/122; 438/455; 438/458; 257/678

(58) Field of Classification Search ........... 438/106, 438/113, 118, 119, 121, 122, 125, 127, 459, 438/460; 257/678
See application file for complete search history.

(56) References Cited

U.S. PATENT DOCUMENTS 6,232,152 B1* 5/2001 DiStefano et al. ........... 438/124
2005/0148160 A1* 7/2005 Farnworth et al. .......... 438/462
2007/0166878 A1* 7/2007 Li .............................. 438/106
2008/0003719 A1* 1/2008 Lu et al. ..................... 438/113
2008/0044985 A1* 2/2008 Polinsky et al. ............ 438/460

OTHER PUBLICATIONS

So, William W., et al., "High Temperature Joints Manufactured at Low Temperature", IEEE, 1998, Electronics Components and Technology Conference, pp. 284-291.
Bock, K., et al., "New Manufacturing Concepts for Ultra-Thin Silicon and Gallium Arsenide Substrates", 2003, International Conf. on Compound Semiconductor Mfg.

* cited by examiner

*Primary Examiner*—Michael Lebentritt
*Assistant Examiner*—Daniel Whalen
(74) *Attorney, Agent, or Firm*—Blakely, Sokoloff, Taylor & Zafman LLP

(57) ABSTRACT

An embodiment of the present invention is a technique to fabricate a package. A metal sheet having trenches is formed. A thinned wafer supported by a wafer support substrate (WSS) is formed. The metal sheet is bonded to the WSS-supported thinned wafer to form a metal bonded thinned wafer. The thinned wafer is diced to the trenches into die assemblies.

9 Claims, 9 Drawing Sheets

US 7,435,664 B2

WAFER-LEVEL BONDING FOR MECHANICALLY REINFORCED ULTRA-THIN DIE

BACKGROUND

1. Field of the Invention

Embodiments of the invention relate to the field of semiconductor, and more specifically, to semiconductor packaging.

2. Description of Related Art

Advances in packaging technologies for semiconductor devices have provided many opportunities for development of efficient thermal management. In addition, the demand for small footprint devices for use in applications such as smart cards, cellular devices, mobile communication, and mobile computing has led to many challenges in fabrication technologies. One such challenge is the development of ultra-thin packages. Ultra-thin packages require reduced die thickness. The reduction of the die thickness becomes even more difficult as the diameter of the wafer is increased.

Existing techniques for thermal management on ultra-thin dice have a number of disadvantages. During the fabrication phase, handling ultra-thin devices is difficult. The ultra-thin wafers need to be handled carefully due to their flexibility and the fragility of the resulting singulated dice. The use of adhesive tapes is limited by the non-uniformity of the tape. Most of the available glues are thermally stable up to about 120° C., which may be too low for additional thermal processing. Other techniques such as dicing before grinding (DBG) may cause additional damage to the dies or wafers.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to fabricate a package. A metal sheet having trenches is formed. A thinned wafer supported by a wafer support substrate (WSS) is formed. The metal sheet is bonded to the WSS-supported thinned wafer to form a metal bonded thinned wafer. The thinned wafer is diced to the trenches into die assemblies.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to fabricate a package. A metal sheet (e.g., a copper sheet) with pre-etched trenches which match the saw streets of an ultra-thin silicon wafer is bonded to the silicon wafer while the silicon wafer is still attached to a wafer support substrate (WSS). The bonding is performed by reflowing the solder layers deposited on the metal sheet and the wafer. The solder composition is carefully designed such that after bonding, the solder bond is substantially or fully converted to intermetallics and thus can stand the downstream processing temperatures. After the WSS demounting or release, the metal reinforced thin wafer may be singulated by dicing through the silicon and the metal base to the pre-etched trenches. The singulated die assemblies are then assembled into packages. The technique eliminates the difficult problem of handling singulated ultra-thin dice because throughout the process the dice are supported by the WSS and then the metal elements from the metal sheet. In addition, the technique provides a simple bonding process where the attachment of the metal elements and the dice is done at the wafer level. Furthermore, the metal reinforced ultra-thin dice provide superior thermal and mechanical performance.

Figure 1A:
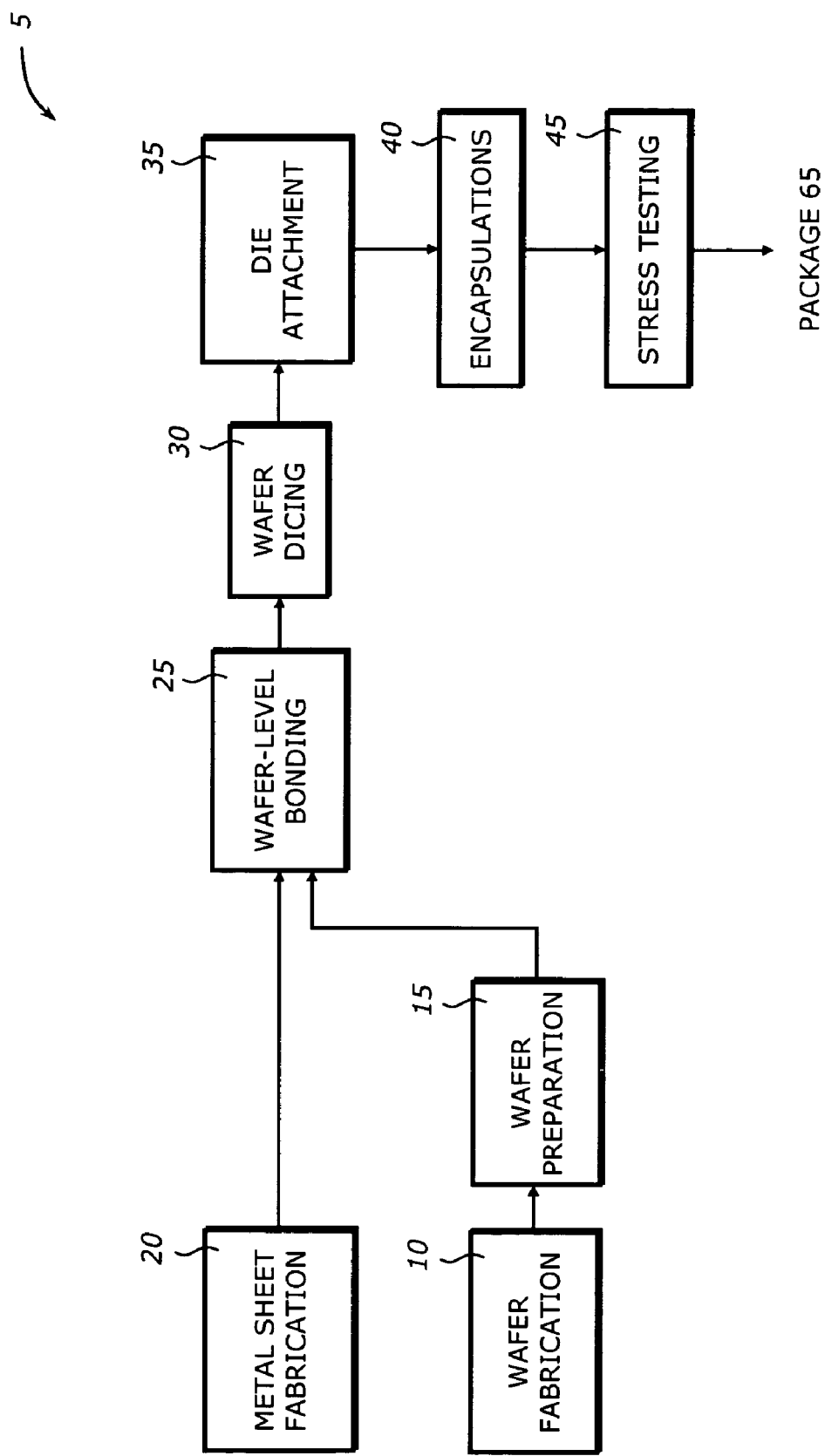
FIG. 1A is a diagram illustrating a manufacturing system in which one embodiment of the invention can be practiced.

FIG. 1A is a diagram illustrating a manufacturing system 5 in which one embodiment of the invention can be practiced. The system 5 includes a wafer fabrication phase 10, wafer preparation phase 15, a metal sheet fabrication phase 20, a wafer-level bonding phase 25, a wafer dicing phase 30, a die attachment phase 35, an encapsulation phase 40, and a stress testing phase 45. The system 5 represents a manufacturing flow of a semiconductor packaging process.

The wafer fabrication phase 10 fabricates the wafer containing a number of dice. The individual dice may be any microelectronic devices such as microprocessors, memory devices, interface circuits, etc. The wafer fabrication phase 10 includes typical processes for semiconductor fabrication such as preparation of the wafer surface, growth of silicon dioxide (SiO$_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or copper. The various metal layers are interconnected by etching holes, called "vias," in the insulating material.

The wafer preparation phase 15 prepares a wafer containing dice for packaging and testing. During this phase, the wafers are sorted after the patterning process. An inspection may be carried out to check for wafer defects. Then, the wafer may be mounted on a wafer support substrate (WSS) that adheres to the front side or bump side of the wafer. The WSS provides mechanical support for handling during subsequent phases. The wafer is then thinned to a desired thickness to provide ultra-thin wafer. Additional processing may be performed to prepare the wafer for subsequent phases, such as depositing first thermal interface material (TIM) or solder layer on the wafer.

The metal sheet fabrication phase 20 fabricates a metal sheet to be bonded to the wafer. Trenches are pre-etched on the metal sheet. This phase may be performed at facilities other than the semiconductor fabrication facilities, such as those of metal sheet vendors. The information of the geometry such as the streets on the wafer may be used in etching the trenches. A solder layer may be deposited on the base of the metal sheet for bonding. The thickness and the type of solder material depend on the desired bonding temperatures and other thermal considerations.

The wafer-level bonding phase 25 bonds the metal sheet to the wafer. The metal sheet is aligned with the wafer so that the trenches match the streets on the wafer. The bonding may include a reflow at increasing temperatures followed by an annealing phase. The temperatures may depend on the type of the solder materials used on the metal sheet and the wafer, and the resulting solder composite.

The wafer dicing phase 20 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The die attachment phase 35 attaches the die to a package substrate. The substrate material depends on the packaging type. It may be an organic (such as FR4) or inorganic material (such as silicon). Flip chip solder joints may be used to connect the bond pads on the die or dice to the substrate.

The encapsulation phase 40 underfills the die and the substrate. Underfill material may be dispensed between the die and the substrate. Integrated heat spreader (IHS) may be attached to the die and substrate assembly. The encapsulated assembly of the die and substrate becomes a package 65 ready to be tested.

The stress testing phase 45 performs one or more tests such as Highly Accelerated Stress Test (HAST) or biased-HAST on the device package under stress conditions. A test chamber may be designed to conduct a stress test. It may have monitoring circuits, measurement circuits, and other data processing equipment. The package 65 is placed in the test chamber subject to the stress test. It may be powered or non-powered. Various stress tests may be performed on the wafer or on the packaged devices 65 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 1B:
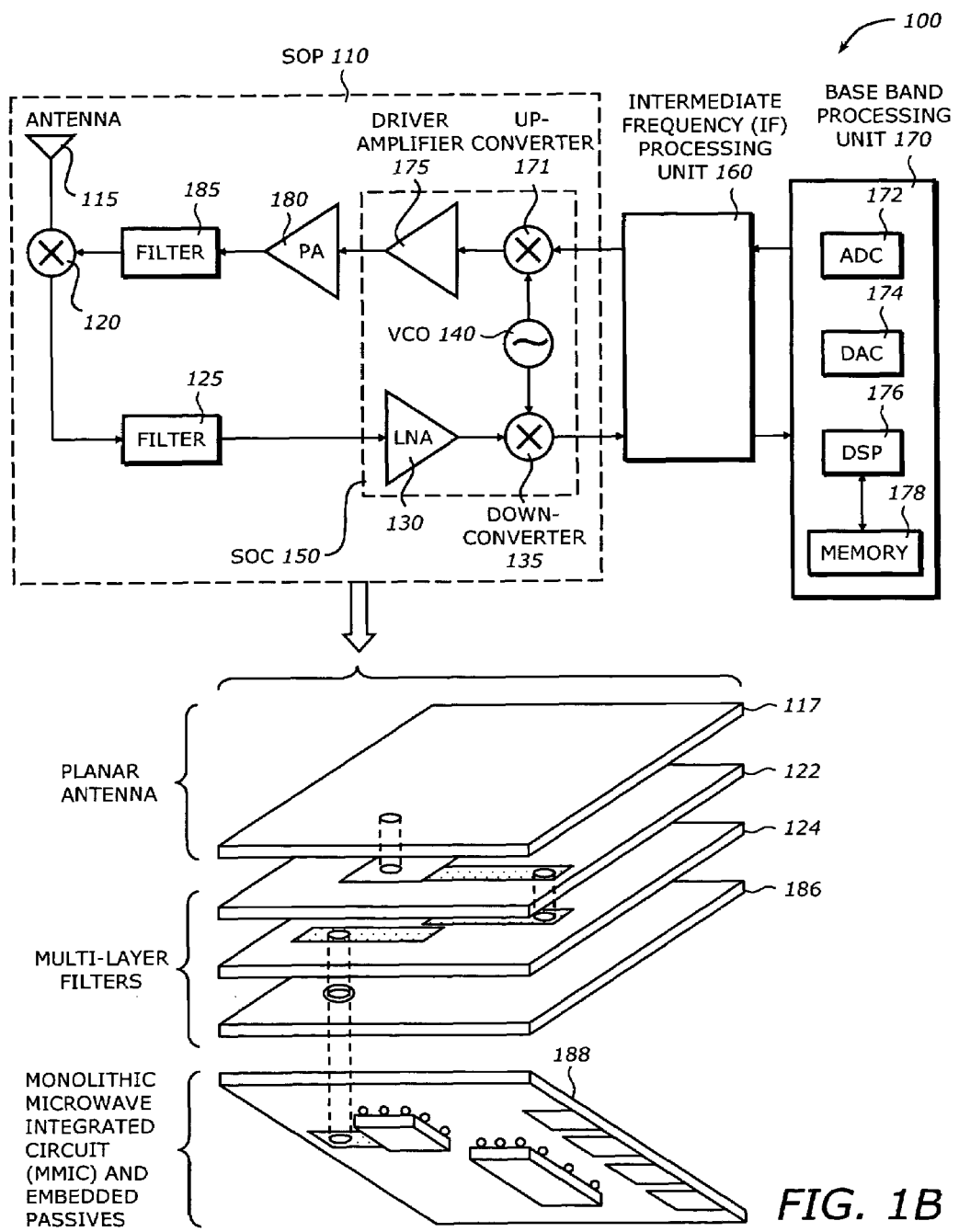
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and memory device 178. The ADC 172 and the DAC 174 are used to convert analog signals to digital data and digital data to analog signal, respectively. The DSP 176 is a programmable processor that may execute a program to process the digital data. The memory device 178 may be flash memories or random access memories. It may be packaged using Flip-Chip Ball Grid Array (FCBGA) packaging technology, a molded packaging, or any other suitable packaging technologies. The memory device 178 may be manufactured according to the manufacturing flow 10 shown in FIG. 1A. It may be the device package 65. It may include a stacked-die assembly in the package. The base-band processing unit 170 may also include memory and peripheral components. The DSP 176 may, therefore, be coupled to the front end processing unit via the IF processing unit 160 and/or the base-band processing unit 170 to process the digital data.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The 3D architecture may include multiple layers include a layer 117 to implement the antenna 115, layers 122, 124, and 186 for the filters 125 and 185, and layer 188 for the SOC 150 and the passive components using EP technology. Typically, the packaging technology involves embedded passives with multiple layers.

Figure 2A:
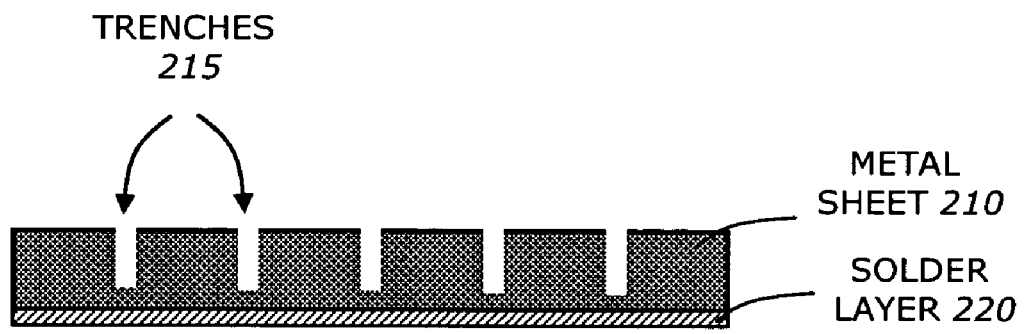
FIG. 2A is a diagram illustrating a metal sheet according to one embodiment of the invention.

FIG. 2A is a diagram illustrating a metal sheet assembly 200A according to one embodiment of the invention. The metal sheet assembly 200A includes a metal sheet 210 and a solder layer 220. The metal sheet assembly 200A may be fabricated separately and independently from the other packaging phases. It may be fabricated in the metal sheet fabrication phase 20 shown in FIG. 1A.

The metal sheet 210 may be made of a suitable metal or metal alloy that has a high thermal conductivity, such as copper. It is slightly larger than the wafer. The metal sheet 210 has a number of trenches 215 etched to a predefined depth and width. The dimensions (e.g., depth and width) and positions of the trenches 215 are carefully matched to the streets of the wafer or the areas that are diced during the wafer dicing phase 30. These areas also correspond to the locations of the individual dice on the wafer.

The solder layer 220 is deposited on the base of the metal sheet 210. It is used to bond to the wafer during the wafer-level bonding phase 25. It may be made of indium (In), silver (Ag), tin (Sn), or copper (Cu), such that the resulting bonding composite when bonded may provide high temperature joints at a much lower bonding temperature. For example, In—Ag joints processed at 210° C. for bonding and 150° C. for annealing has a re-melting point of approximately 700° C. Similarly, Sn—Cu joints processed at 415° C. for bonding and 280° C. for annealing has a re-melting point of approximately 700° C. The composition may be selected on a weight percentage basis according to the solder system. For example, for the In—Ag system, the composition may be approximately 75 weight % of Ag and 25 weight % In. For the Cu—Sn system, the composition may be approximately 69 weight % of Cu and 31 weight % of Sn. It is contemplated a tolerance of +/−10% may be used for the compositions. The thickness of the solder layer 220 depends on the type of material and may range from 2 μm to 6 μm.

Figure 2B:
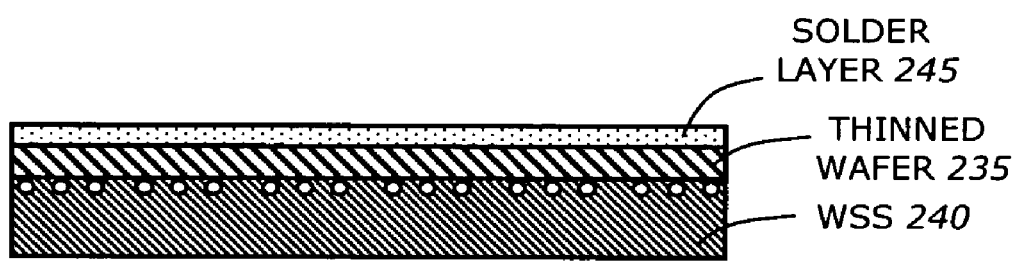
FIG. 2B is a diagram illustrating a thinned wafer supported by a wafer support substrate (WSS) according to one embodiment of the invention.

FIG. 2B is a diagram illustrating a thinned wafer assembly 200B supported by a wafer support substrate (WSS) according to one embodiment of the invention. The thinned wafer assembly 200B includes a thinned wafer 235, a WSS 240, and a solder layer 245.

First, a wafer is mounted on the WSS 240. The mounting may be performed by attaching the wafer to the WSS 240 using an attachment material such as adhesive. The adhesive may be applied locally to facilitate removal of the WSS 240. The WSS 240 may be any suitable support material, such as a glass wafer or a glass support plate. The wafer may then be thinned to a desired thickness using any suitable thinning technique, such as mechanical grinding, chemical mechanical polishing (CMP), or wet etching, etc. For ultra-thin wafer, the desired thickness may be less than 75 μm, or approximately 50 μm.

Then, the solder layer 245 may be applied on the thinned wafer 235. The solder layer 245 may have a thin thickness sufficient to facilitate bonding to the metal sheet assembly 200A. Like the solder layer 220, it may be made of indium (In), silver (Ag), tin (Sn), or copper (Cu), such that the resulting bonding composite when bonded with the metal sheet is In—Ag or Sn—Cu. The thickness of the solder layer 245 depends on the type of material and may range from 2 μm to 6 μm.

Figure 2C:
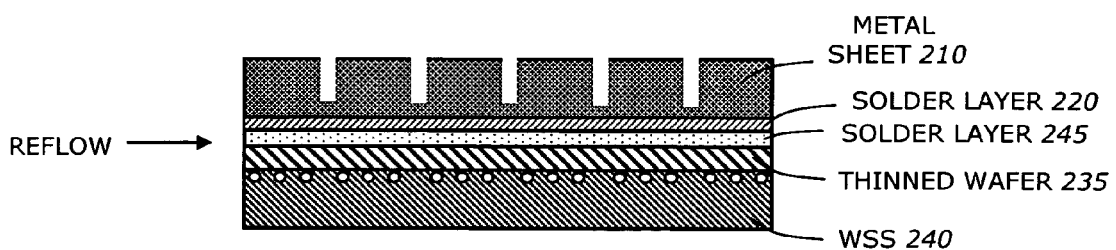
FIG. 2C is a diagram illustrating bonding the metal sheet to the thinned wafer according to one embodiment of the invention.

FIG. 2C is a diagram illustrating bonding the metal sheet to the thinned wafer according to one embodiment of the invention. The metal sheet assembly 200A is bonded to the thinned wafer assembly 200B in the wafer-level bonding phase 25 shown in FIG. 1A. The solder layer 220 on the metal sheet assembly 200A faces the solder layer 245 on the wafer assembly 200B.

The sheet metal assembly 200A is aligned with the thinned wafer assembly 200B such that the etched trenches 215 are aligned with the streets on the thinned wafer 235. Since the trenches 215 are etched to match the dimensions and positions of the streets on the thinned wafer 235, the alignment may be carried out easily.

Bonding the two assemblies may be performed by reflowing the solder layers 220 and 245. The two solder layers are attached or bonded to each other and are converted into an intermetallic layer 250. The bonding may take place in two phases. First, the reflow is done at increasing temperatures to a desired temperature (e.g., 210° C. for the In—Ag system). Then, the melted solder layers undergo an annealing phase at approximately 150° C. The intermetallic layer 250 has good thermal property and may serve as a thermal interface material (TIM) when the individual dice are encapsulated into packages. The thickness of the resulting intermetallic layer 250 may range from approximately 31 μm to 10 μm.

Figure 2D:
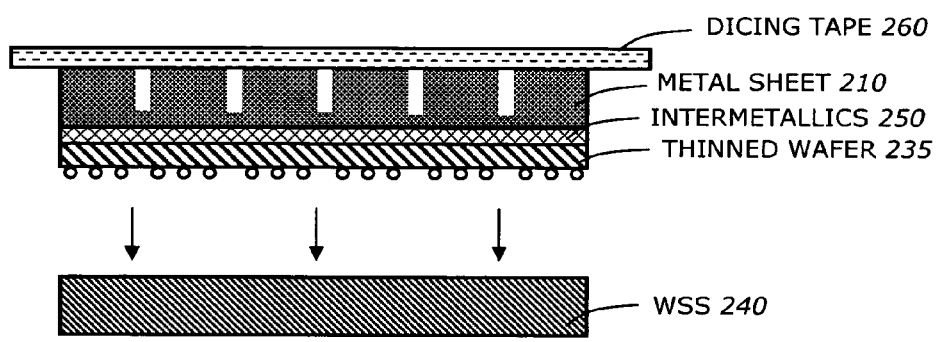
FIG. 2D is a diagram illustrating releasing the WSS from and attaching a dicing tape to the metal bonded thinned wafer according to one embodiment of the invention.

FIG. 2D is a diagram illustrating releasing the WSS from and attaching a dicing tape to the metal bonded thinned wafer according to one embodiment of the invention.

After bonding, the WSS 240 may be released from the bonded assemblies. The release of the WSS 240 may be performed using a laser to decompose the adhesive that attaches the WSS 240 to the wafer 235. When the adhesive is weakened, the WSS 240 may be removed by any suitable technique such as mechanical removal.

The bonded assemblies may then be mounted on a dicing tape 260 to prepare for wafer dicing. The dicing tape 260 holds the singulated dice together after dicing. It may be made by any suitable flexible material such as polyvinyl chloride (PVC) with synthetic acrylic bonded to one side.

Figure 2E:
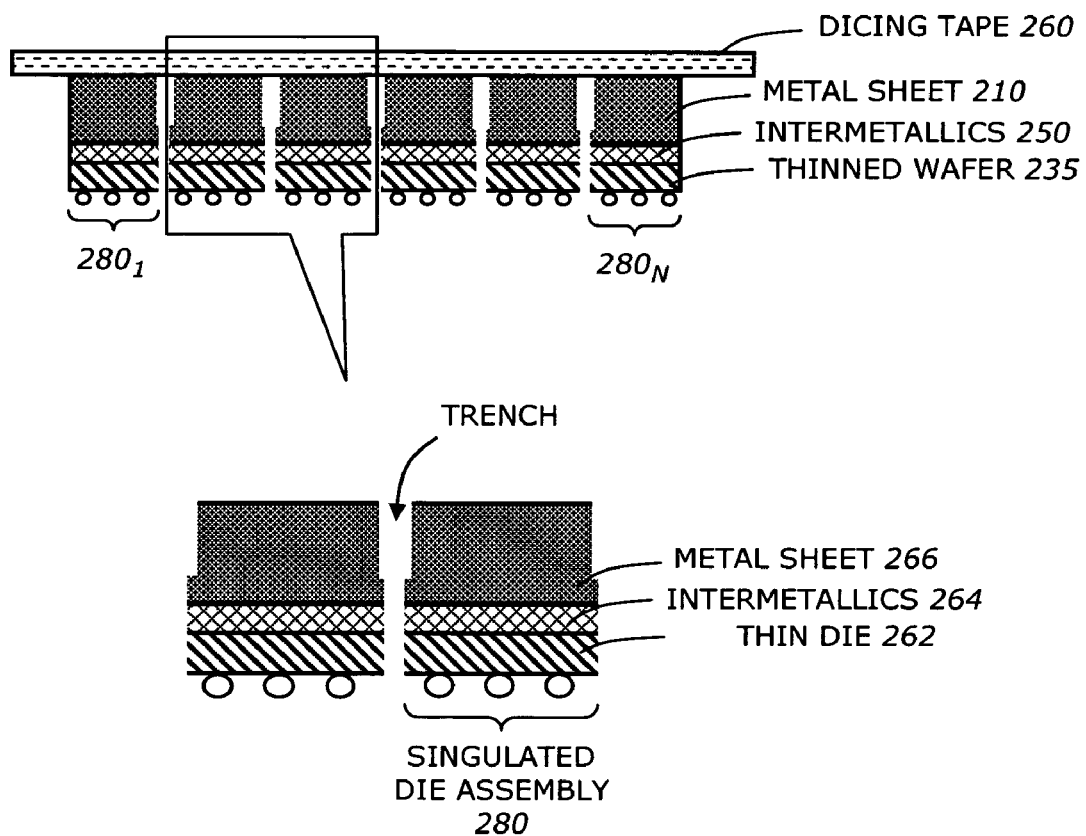
FIG. 2E is a diagram illustrating dicing the metal bonded thinned wafer according to one embodiment of the invention.

FIG. 2E is a diagram illustrating dicing the metal bonded thinned wafer according to one embodiment of the invention. The metal bonded thinned wafer assembly is diced into individual die assemblies $280_i$ (i=1, . . . , N).

The dicing may be performed using any suitable dicing technique. For example, an abrasive diamond blade, rotating at speeds of up to 60,000 rpm, may be used. The dicing cuts through the streets, or the dedicated dicing areas around the individual dice, on the thinned wafer, the intermetallic layer 250, and the base of the metal sheet 210 to the trenches. The dicing is such that the adjacent thin dice are separated by a gap slightly smaller than the trench separating them. A singulated die assembly 280 thus includes a thin die 262, an intermetallic layer 264, and a metal element 266. As discussed above, the metal element 266 may be made of high thermally conductive material such as copper. It may serve as a heat spreader attached to the die 262. The intermetallic layer 264 may serve as a first TIM in the resulting package.

Figure 3:
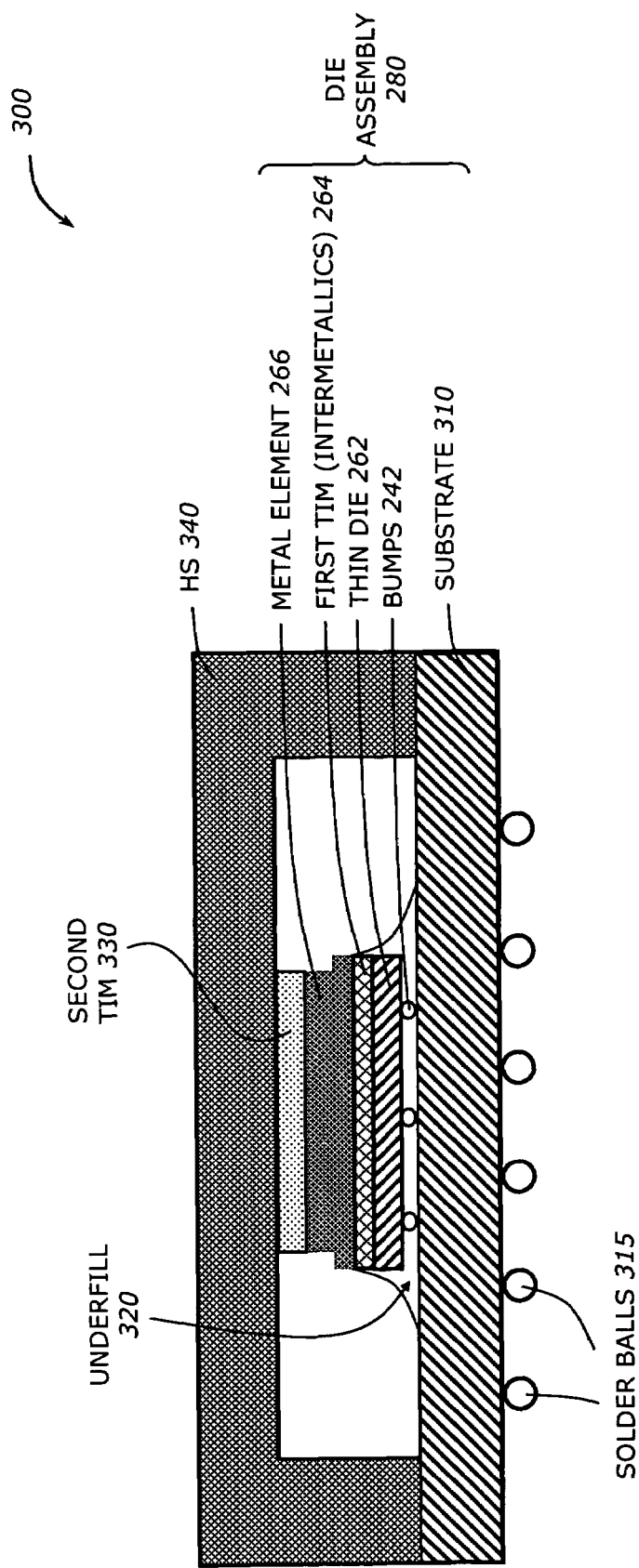
FIG. 3 is a diagram illustrating a package according to one embodiment of the invention.

FIG. 3 is a diagram illustrating a package 300 according to one embodiment of the invention. The package 300 includes a substrate 310, a die assembly 280, an underfill 320, a second TM 330, and an integral heat spreader (IHS) 340. The die assembly 280 includes the thin die 262, a first TIM 264, and the metal element 266. The package 300 may be a package for the memory 76 or the DSP 176 shown in FIG. 1.

The substrate 310 is a package substrate that provides support for the die 220. The substrate 310 may be polymer or a composite. The substrate 310 contains a reduced number of internal layers. The substrate 310 may be selected for any suitable packaging technologies including Ball Grid Array (BGA), Pin Grid Array (PGA), or Land Grid Array (LGA). A number of solder balls 315 may be attached to the substrate 310. The solder balls 315 allow attachment of the package device 65/176 to a circuit board or to any other mounting component. The die 262 is any semiconductor die. It may have a microelectronic device such as a microprocessor, a memory, an interface chip, an integrated circuit, etc. The die 262 is attached to the substrate 110 by a number of solder bumps 242. The bumps 242 provide contact with the contact pads on the substrate. The bumps 242 may be fabricated using any standard manufacturing or fabrication techniques such as the controlled collapse chip connect (C4) technique.

The underfill 320 is dispensed between die 262 and the substrate 310 to strengthen the attachment of die 262 to the substrate 310 to help prevent the thermal stresses from breaking the connections between die 262 and the substrate 310. The stresses may be caused by the difference between the coefficients of thermal expansion of die 262 and the substrate 310. The underfill 320 may contain filler particles suspended in an organic resin. The size of the filler particles are typically selected according to a gap between the die 240 and the substrate 210, e.g., the filler particles have a diameter about one third the size of the gap. Generally, the composition and concentration of filler particles are selected to control the coefficient of thermal expansion and the shrinkage of the underfill 320.

The IHS 340 may house or cover the die assembly 280 on the substrate 310. It may include a flat surface and supporting walls on both or four sides of the die assembly 280. During operation, the die 262 may generate heat. The heat may be transferred to the IHS 340 through the first TIM 264 and a second TIM 330. The second TIM 330 may have a thickness of approximately 50 µm, or approximately five times or more thicker than the first TIM 250. The TIM 330 may be located, or interposed, between the bottom surface of the IHS 250 and the top surface of the metal element 266. It may be attached to a heat generating device, such as the die 262, to transfer the heat to a heat spreader or a heat sink or any another heat dissipating device. The TIM 330 may be made of a solder, a thermally conductive adhesive, a thermal grease, etc.

The package 300 thus has two heat spreaders: the metal element 266 and the IHS 340. The two heat spreaders may be of the same or different materials. The package 300 also has TIMs: the first TIM (intermetallic layer) 264 and the second TIM 330. The package 300 therefore has a good heat transfer due to two TIMs and two heat spreaders.

Figure 4:
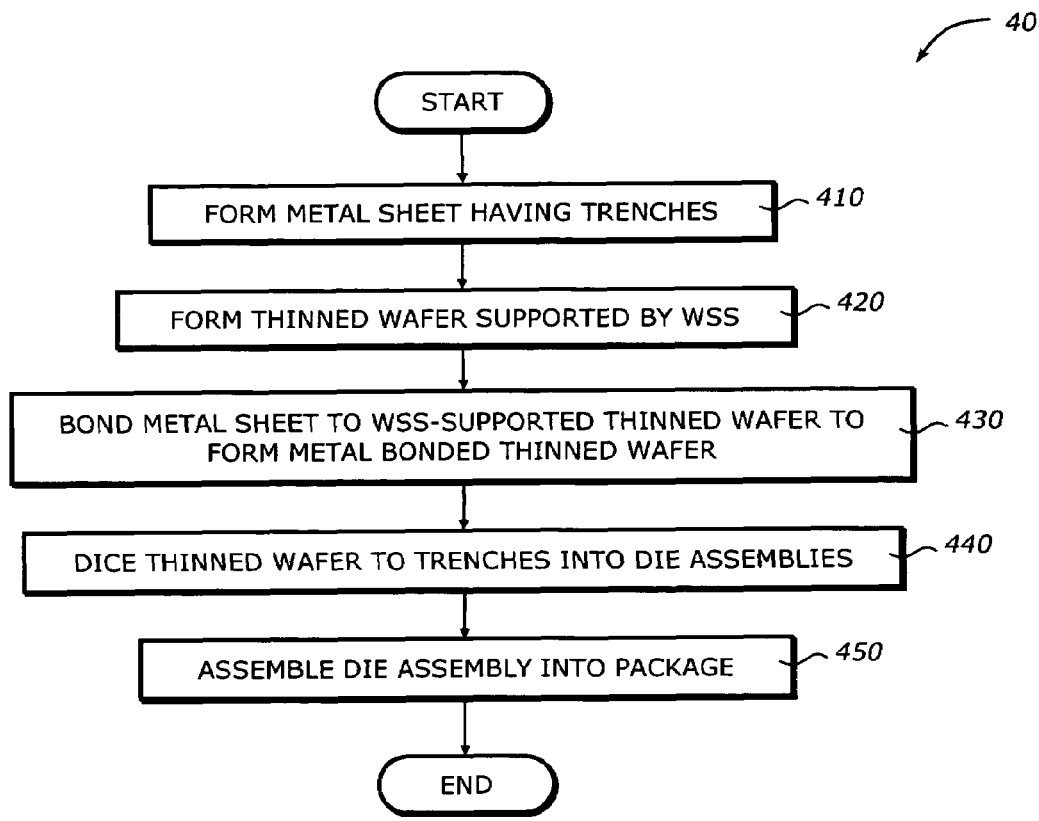
FIG. 4 is a flowchart illustrating a process to fabricate a package according to one embodiment of the invention.

FIG. 4 is a flowchart illustrating a process 400 to fabricate a package according to one embodiment of the invention.

Upon START, the process 400 forms a metal sheet having trenches (Block 410). Next, the process 400 forms a thinned wafer supported by a wafer support substrate (WSS) (Block 420). Then, the process 400 bonds the metal sheet to the WSS-supported thinned wafer to form a metal bonded thinned wafer (Block 430). Next, the process 400 dices the thinned wafer to the trenches into die assemblies (Block 440). Then, the process 400 assembles a die assembly into a package (Block 450). The process 400 is then terminated.

Figure 5:
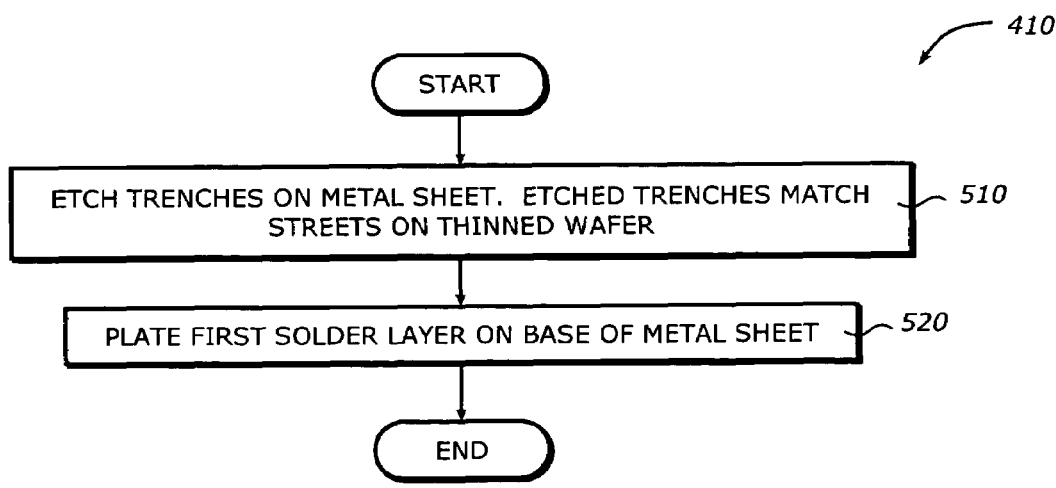
FIG. 5 is a flowchart illustrating a process to form a metal sheet according to one embodiment of the invention.

FIG. 5 is a flowchart illustrating the process 410 shown in FIG. 4 to form a metal sheet according to one embodiment of the invention.

Upon START, the process 410 etches the trenches on the metal sheet (Block 510). The etched trenches match the streets on the thinned wafer. Next, the process 410 plates a first solder layer on base of the metal sheet (Block 520). The process 410 is then terminated.

Figure 6:
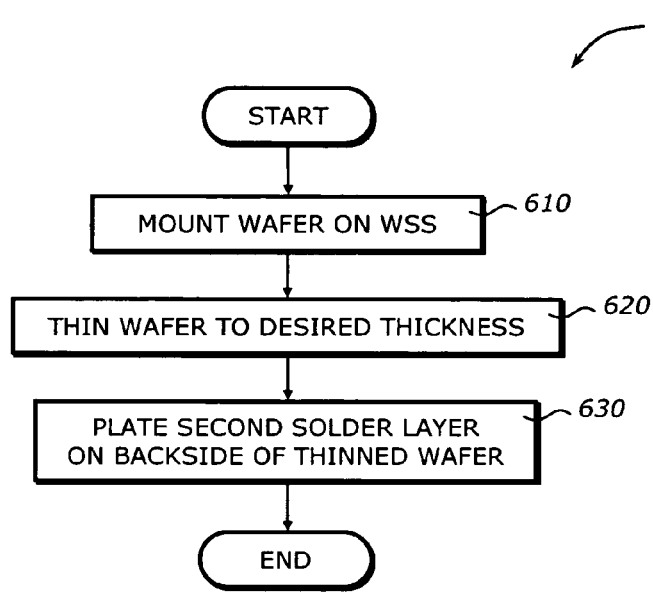
FIG. 6 is a flowchart illustrating a process to form a thinned wafer supported by a WSS according to one embodiment of the invention.

FIG. 6 is a flowchart illustrating the process 420 shown in FIG. 4 to form a thinned wafer supported by a WSS according to one embodiment of the invention.

Upon START, the process 420 mounts a wafer on the WSS (Block 610). Next, the process 420 thins the wafer to a desired thickness (Block 620). The desired thickness may be less than 75 µm. Then, the process 420 plates a second solder layer on backside of the thinned wafer (Block 630). The process 420 is then terminated.

Figure 7:
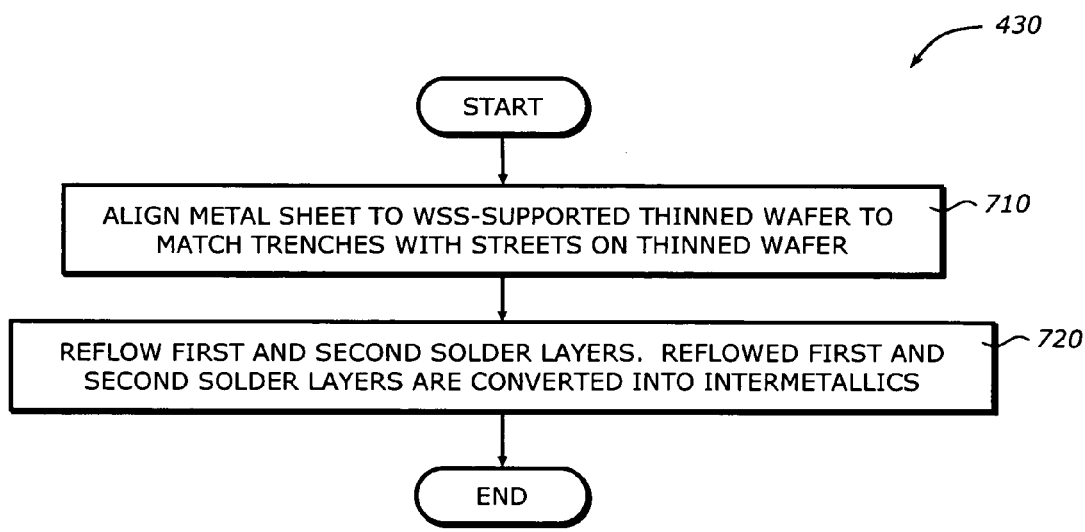
FIG. 7 is a flowchart illustrating a process to bond the metal sheet to the WSS-supported thinned wafer according to one embodiment of the invention.

FIG. 7 is a flowchart illustrating the process 430 shown in FIG. 4 to bond the metal sheet to the WSS-supported thinned wafer according to one embodiment of the invention.

Upon START, the process 430 aligns the metal sheet to the WSS-supported thinned wafer to match trenches with the streets on the thinned wafer (Block 710). Next, the process 430 reflows the first and second solder layers (Block 720). The reflowed first and second solder layers are converted into intermetallics (IMC). The process 430 is then terminated.

Figure 8:
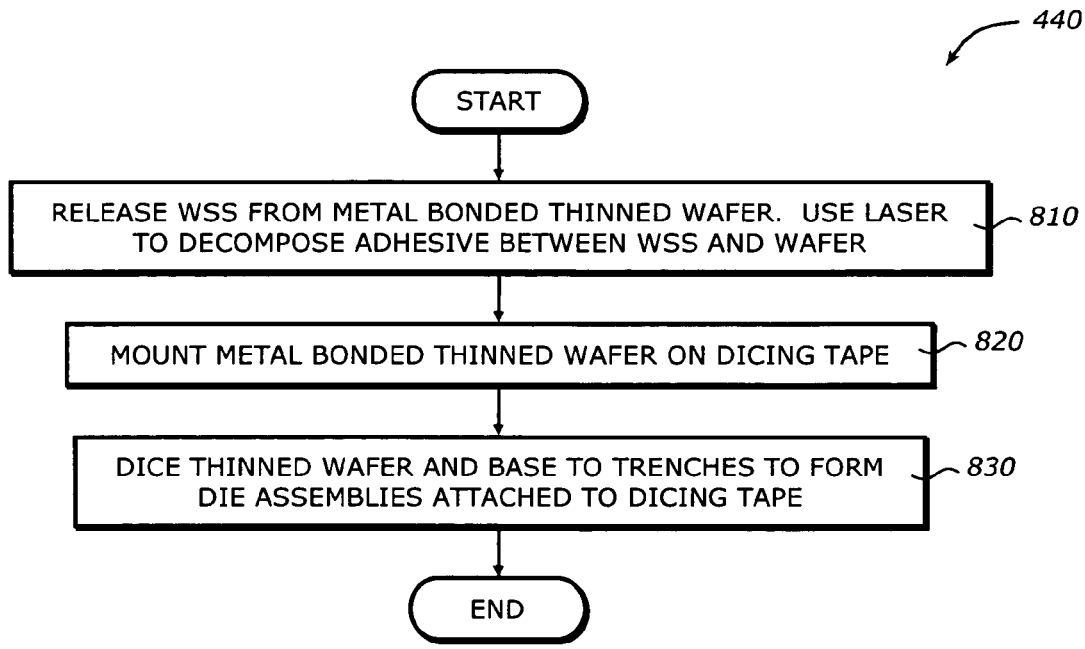
FIG. 8 is a flowchart illustrating a process to dice the thinned wafer into die assemblies according to one embodiment of the invention.

FIG. 8 is a flowchart illustrating the process 440 shown in FIG. 4 to dice the thinned wafer into die assemblies according to one embodiment of the invention.

Upon START, the process 440 releases the WSS from the metal bonded thinned wafer (Block 810). This may be performed by using a laser beam to decompose adhesive between the WSS and the wafer. Next, the process 440 mounts the metal bonded thinned wafer on a dicing tape (Block 820). Then, the process 440 dices the thinned wafer and the base to the trenches to form the die assemblies attached to the dicing tape (Block 830). The process 440 is then terminated.

Figure 9:
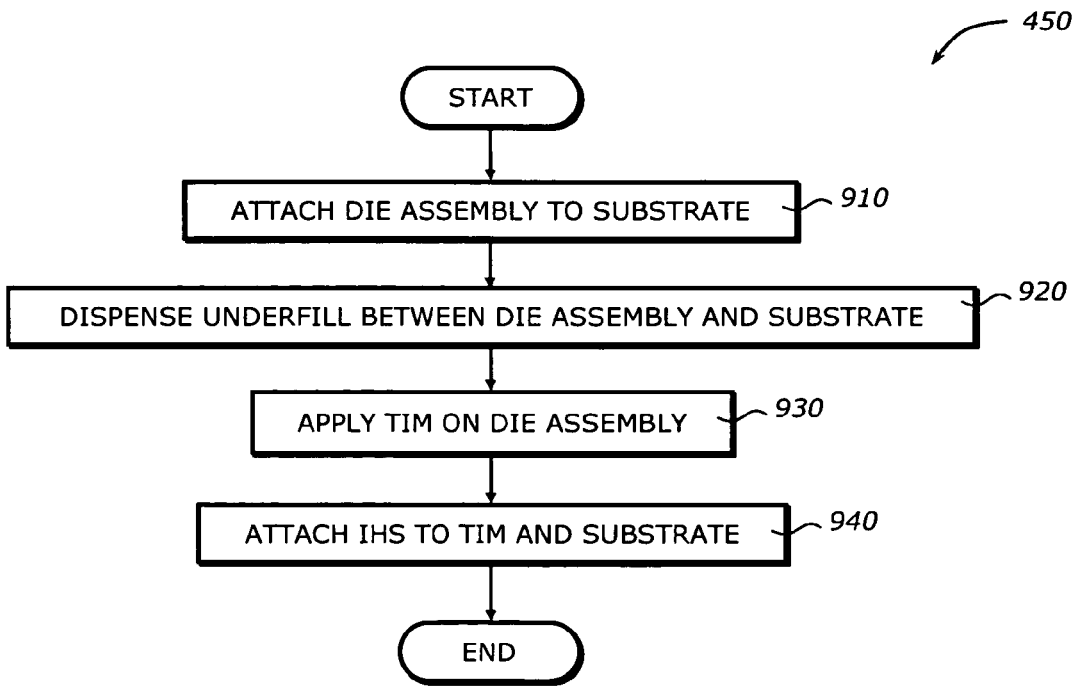
FIG. 9 is a flowchart illustrating a process to assemble a die assembly a package according to one embodiment of the invention.

FIG. 9 is a flowchart illustrating the process 450 to assemble a die assembly a package according to one embodiment of the invention.

Upon START, the process 450 attaches the die assembly to a substrate (Block 910). Next, the process 450 dispenses an underfill between the die assembly and the substrate (Block 920). Then, the process 450 applies a thermal interface material (TIM) on the die assembly (Block 930). Next, the process 450 attaches an integral heat spreader (IHS) to the TIM and the substrate (Block 940). The process 450 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   forming a metal sheet having trenches;
   forming a wafer support substrate (WSS)-supported thinned wafer from a thinned wafer and a WSS
   bonding the metal sheet to the WSS-supported thinned wafer to form a metal bonded thinned wafer; and
   dicing the metal bonded thinned wafer to the trenches into dies assemblies.

2. The method of claim 1 further comprising:
   assembling a die assembly into a package.

3. The method of claim 1 wherein forming the metal sheet comprises:
   etching the trenches on the metal sheet, the etched trenches matching streets on the thinned wafer; and
   plating a first solder layer on base of the metal sheet.

4. The method of claim 3 wherein forming the WSS-supported thinned wafer comprises:
   mounting a wafer on the WSS;
   thinning the wafer to a desired thickness; and plating a second solder layer on backside of the thinned wafer.

5. The method of claim 4 wherein bonding the metal sheet to the WSS-supported thinned wafer comprises:
aligning the metal sheet to the WSS-supported thinned wafer to match trenches with the streets on the thinned wafer; and
reflowing the first and second solder layers, the reflowed first and second solder layers being converted into intermetallics.

6. The method of claim 5 wherein dicing the metal bonded thinned wafer comprises:
releasing the WSS from the metal bonded thinned wafer;
mounting the metal bonded thinned wafer on a dicing tape; and
dicing the metal bonded thinned wafer and the base to the trenches to form the die assemblies attached to the dicing tape.

7. The method of claim 6 wherein releasing the WSS comprises:
decomposing adhesive between the WSS and the wafer by laser.

8. The method of claim 2 wherein assembling the die assembly comprises:
attaching the die assembly to a substrate;
dispensing an underfill between the die assembly and the substrate;
applying a thermal interface material (TIM) on the die assembly; and
attaching an integral heat spreader to the TIM and the substrate.

9. The method of claim 4 wherein the first and second solder layers form an indium-silver (In—Ag) or tin-copper (Sn—Cu) solder.

* * * * *